United States Patent
Lin

(10) Patent No.: US 11,600,738 B2
(45) Date of Patent: Mar. 7, 2023

(54) PHOTO DETECTOR

(71) Applicant: InnoCare Optoelectronics Corporation, Tainan (TW)

(72) Inventor: Hsin-Hung Lin, Tainan (TW)

(73) Assignee: InnoCare Optoelectronics Corporation, Tainan (TW)

( * ) Notice: Subject to any disclaimer, the term of this patent is extended or adjusted under 35 U.S.C. 154(b) by 0 days.

(21) Appl. No.: 17/494,843

(22) Filed: Oct. 6, 2021

(65) Prior Publication Data

US 2022/0140171 A1    May 5, 2022

(30) Foreign Application Priority Data

Nov. 5, 2020 (TW) ................... 109138542

(51) Int. Cl.
*H01L 31/119*   (2006.01)
*H01L 31/0224*  (2006.01)

(52) U.S. Cl.
CPC .... *H01L 31/119* (2013.01); *H01L 31/022408* (2013.01)

(58) Field of Classification Search
CPC ................. H01L 31/119; H01L 31/115; H01L 31/022408; H01L 27/146
See application file for complete search history.

(56) References Cited

U.S. PATENT DOCUMENTS

| | | | |
|---|---|---|---|
| 2005/0179964 A1* | 8/2005 | Izumi | H01L 27/14609 257/E31.085 |
| 2007/0051954 A1* | 3/2007 | Yan | H01L 27/1255 257/E27.113 |
| 2013/0207190 A1* | 8/2013 | Kaigawa | H01L 27/14623 438/151 |
| 2016/0049431 A1 | 2/2016 | Taghibakhsh | |

FOREIGN PATENT DOCUMENTS

JP     H05243547 A  *  9/1993
KR   20180044681 A  *  5/2018

* cited by examiner

*Primary Examiner* — Sitaramarao S Yechuri
(74) *Attorney, Agent, or Firm* — JCIPRNET

(57) ABSTRACT

A photo detector including a transistor and a charge storing component is provided. The transistor includes a gate, a source and a drain. The charge storing component is electrically connected with the transistor, and includes a top electrode and a bottom electrode. The source of the transistor, the drain of the transistor and the bottom electrode of the charge storing component are formed of a semiconductor layer.

19 Claims, 11 Drawing Sheets

PHOTO DETECTOR

CROSS-REFERENCE TO RELATED APPLICATION

This application claims the priority benefit of Taiwan application serial no. 109138542, filed on Nov. 5, 2020. The entirety of the above-mentioned patent application is hereby incorporated by reference herein and made a part of this specification.

BACKGROUND

1. Technical Field

The disclosure relates to a photo detector, and more particularly to a photo detector having a transistor and a charge storing component.

2. Description of Related Art

With the development of photo detectors, humans have gradually increased the quality or performance requirements of photo detectors. The photo detectors usually use thin film transistors as switching components, and the performance of the thin film transistors affects the performance of the photo detectors. Therefore, how to improve the detection performance of the photo detectors or reduce the manufacturing process or cost has become a topic of concern in the industry today.

SUMMARY

The photo detector of the present disclosure includes a transistor and a charge storing component. The transistor includes a gate, a source and a drain. The charge storing component is electrically connected with the transistor and includes a top electrode and a bottom electrode. The source and drain of the transistor, and the bottom electrode of the charge storing component are formed by a semiconductor layer.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
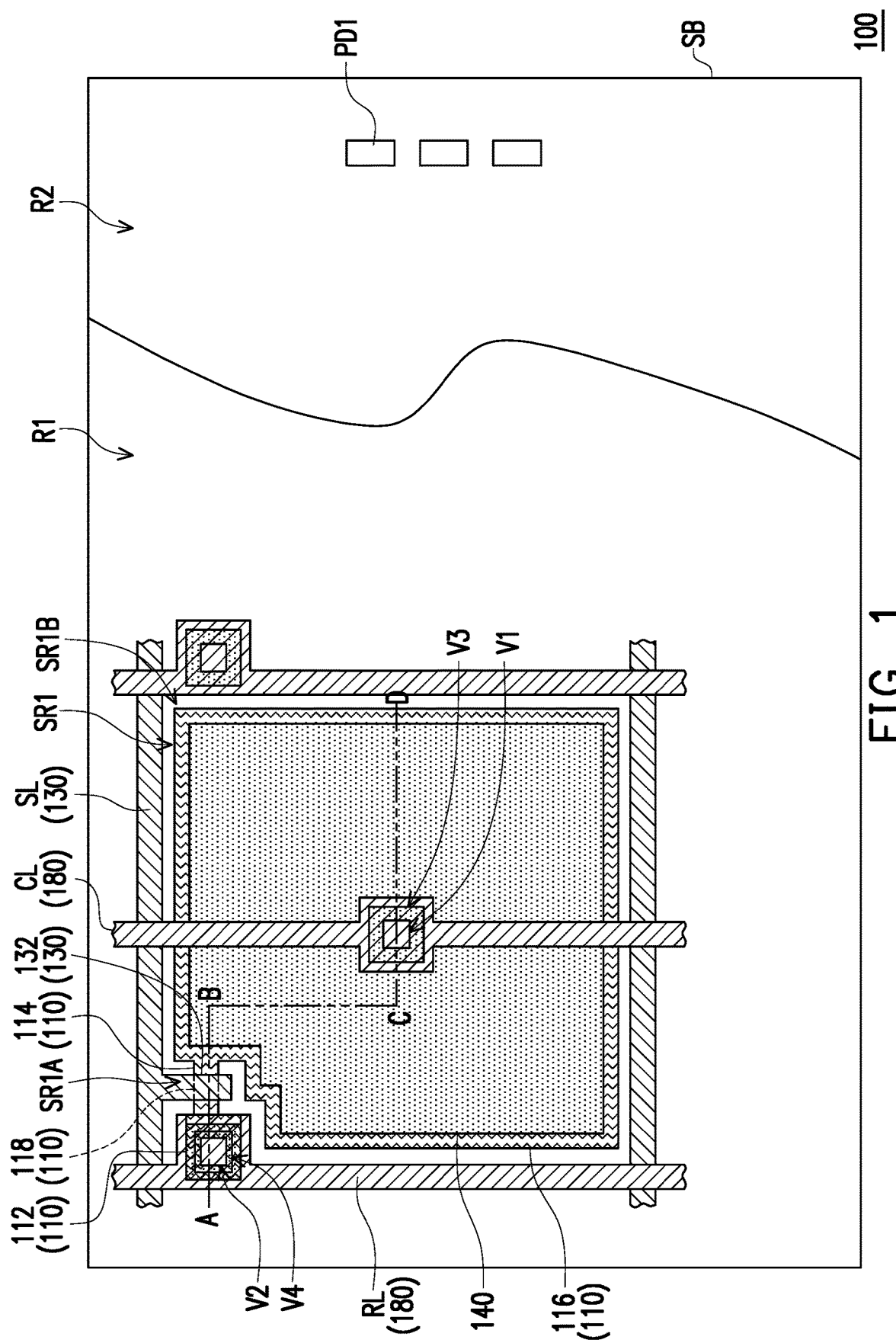
FIG. 1 is a schematic top view of a photo detector according to an embodiment of the disclosure.

The content of the disclosure will be described in detail below in conjunction with specific embodiments and drawings. In order to make the content of the present disclosure clearer and easier to understand, the following drawings may be simplified schematic diagrams, and the components therein may not be drawn to scale. In addition, the number and size of each component in the drawings are merely illustrative, and are not used to limit the scope of the disclosure.

Throughout the disclosure and the appended claims, certain words are used to refer to specific components. Those skilled in the art should understand that electronic device manufacturers may use different names to refer to the same components, and this document does not intend to distinguish those components with the same function but different names. When the terms "include", "provided with" and/or "have" are used in this specification, they specify the existence of the described features, regions, steps, operations, and/or components, but do not exclude the existence or addition of one or more other features, regions, steps, operations, components, and/or combinations thereof.

When a component such as a layer or region is referred to as being "on" another component or extending to be "on" another component (or a variation thereof), it may be directly on the other component or directly extending to be on the other component, or there may be inserted components between the two. On the other hand, when it is described that a component is "directly on" another component (or a variant thereof) or "directly" extends to be "on" another component, there is no intervening component between the two. Also, when a component is referred to as being "coupled" to another component (or a variant thereof), it may be directly connected to another component or indirectly connected (for example, electrically connected) to another component through one or more components.

In the text, the terms "about" and "substantially" usually mean within 10%, within 5%, within 3%, within 2%, within 1%, or within 0.5% of a given value or range. The quantity given here is an approximate quantity; that is, without a specific description of "about" and "substantially", the meaning of "about" and "substantially" may still be implied. In addition, the description "the range is between the first value and the second value" means that the range includes the first value, the second value, and other values between them.

It is understandable that although the terms "first", "second", and the like may be used herein to describe various components, layers and/or parts, the components, layers and/or parts should not be limited by these terms, and these terms are only used to distinguish different components, layers and/or parts. Therefore, a first component, layer and/or part discussed below may be referred to as a second component, layer and/or part without departing from the teachings of some embodiments of this disclosure. In addition, for the sake of brevity, different components may be distinguished in the specification without using terms such as "first" and "second". Without violating the scope defined by the appended claims, the first component and/or the second component described in the claims may be interpreted as any component that meets the description in the specification.

In this disclosure, the thickness, length, and width may be measured by using an optical microscope, and the thickness may be measured from a cross-sectional image in an electron microscope, but the disclosure is not limited thereto. In addition, there may be a certain difference in any two values or directions used for comparison. If the first value is equal to the second value, it implies that there may be an difference of about 10% between the first value and the second value; if the first direction is perpendicular to the second direction, the angle between the first direction and the second direction may be between 80 degrees and 100 degrees; if the first direction is parallel to the second direction, the angle between the first direction and the second direction may be between 0 to 10 degrees.

Unless otherwise defined, all terms (including technical and scientific terms) used herein have the same meanings as commonly understood by the persons having ordinary skills in the art. It is understandable that these terms, such as those defined in commonly used dictionaries, should be interpreted as having a meaning consistent with the relevant technology and the background or context of this disclosure, and not in an idealized or overly formal way, unless specifically defined here.

It should be noted that the technical solutions provided by the different embodiments below may be used interchangeably, combined or mixed to form another embodiment without violating the spirit of the disclosure.

FIG. 1 is a schematic top view of a photo detector according to an embodiment of the disclosure. A photo detector 100 includes a substrate SB, a scan line SL, a readout line RL, and a bias line CL provided on the substrate SB. The photo detector 100 may define multiple detection units SR1 through multiple scan lines SL and multiple readout lines RL. The substrate SB has a detection area R1, and a peripheral area R2 located beside the detection area R1. The detection units SR1 are disposed on the substrate SB and located in the detection area R1, and bonding pads PD1 are disposed on the substrate SB and located in the peripheral area R2. For clarity, FIG. 1 shows only one detection unit SR1 and three bonding pads PD1, but the disclosure is not limited thereto. The multiple detection units SR1 may be disposed on the substrate SB, and the multiple detection units SR1 may be arranged in an array or distributed in other arrangements in the detection area R1. In FIG. 1, the detection unit SR1 of the photo detector may include a transistor SR1A and a charge storing component SR1B; the charge storing component SR1B is electrically connected with the transistor SR1A. The transistor SR1A includes a gate 132, a source 112, and a drain 114. The charge storing component SR1B includes a top electrode 150 and a bottom electrode 116. The gate 132 is electrically connected with the scan line SL. One of the source 112 and the drain 114 is electrically connected with the readout line RL, and the other one of the source 112 and the drain 114 is electrically connected with the charge storing component SR1B (for example, the bottom electrode 116). The charge storing component SR1B (for example, the top electrode 150) may be electrically connected with the bias line CL, but the disclosure not limited thereto.

Figure 2:
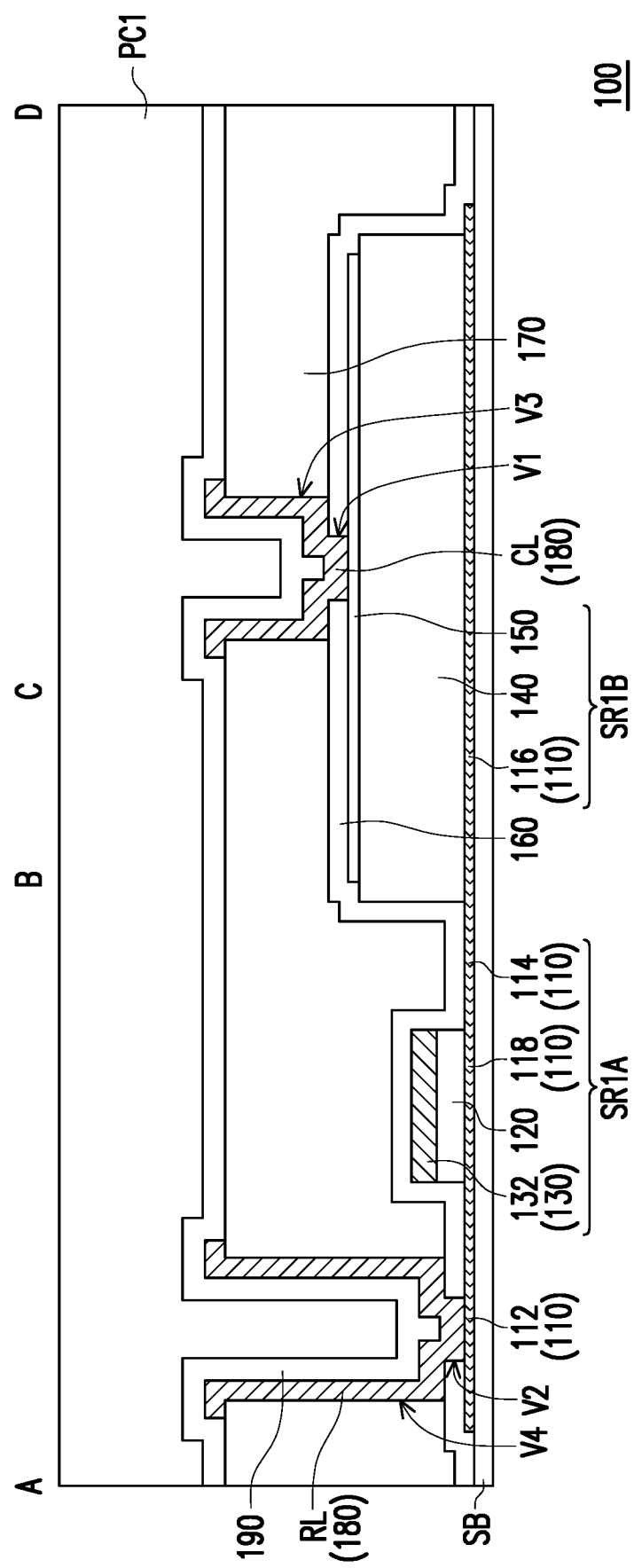
FIG. 2 is a schematic cross-sectional view of a photo detector in FIG. 1 along an A-B-C-D line.

FIG. 2 is a schematic cross-sectional view of a photo detector in FIG. 1 along an A-B-C-D line. Specifically, the photo detector 100 includes multiple film layers disposed on the substrate SB. The film layers include a semiconductor layer 110, an insulating layer 120, a metal layer 130, a photosensitive layer 140, a top electrode 150, an insulating layer 160, a flat layer 170, a metal layer 180, and a protective layer 190 which are sequentially made on the substrate SB, but the disclosure is not limited thereto. In the stacking of the aforementioned multiple film layers, other layers may be optionally inserted, or at least one of the above layers may be removed. In addition, the photo detector 100 may optionally include a light conversion layer PC1; the light conversion layer PC1 may be disposed on the protective layer 190 and cover the substrate SB, but the disclosure is not limited thereto.

In some embodiments, the semiconductor layer 110 may be disposed on the substrate SB, and the semiconductor layer 110 may make the source 112, the drain 114, the bottom electrode 116, and a channel 118, for example. In other words, the source 112, and/or the drain 114 of the transistor SR1A and the bottom electrode 116 of the charge storing component SR1B are formed of the semiconductor layer 110. In some embodiments, the transistor SR1A is provided with the channel 118 disposed between the source 112 and the drain 114, and the channel 118, the source 112, and the drain 114 are coplanar. In some embodiments, the source 112, the drain 114, the bottom electrode 116, and/or the channel 118 are connected to each other, for example, but the disclosure is not limited thereto. In some embodiments, the gate 132 of the transistor SR1A is disposed on the channel 118. In other words, the channel 118 may be defined as the part of the semiconductor layer 110 that overlaps the gate 132 in a normal direction of the substrate SB. As shown in FIG. 2, the source 112 and the drain 114 may be respectively defined as the parts of the semiconductor layer 110 connected to two sides of the channel 118. The bottom electrode 116 may be defined as the part of the semiconductor layer 110 that overlaps the photosensitive layer 140 in the normal direction of the substrate SB. The bottom electrode 116 may belong to part of the charge storing component SR1B. The channel 118, the source 112, and the drain 114 may belong to part of the transistor SR1A.

In some embodiments, the material of the semiconductor layer 110 includes semiconductor material with high carrier mobility, such as metal oxide semiconductors or other oxide semiconductors.

In some embodiments, the insulating layer 120 may be disposed on the semiconductor layer 110 and overlaps the channel 118 in the normal direction of the substrate SB, but the disclosure is not limited thereto. In some embodiments, the metal layer 130 may be disposed on the insulating layer 120. The metal layer 130 may include a gate 132 and/or a scan line SL (as shown in FIG. 1), and the gate 132 may extend from the scan line SL and overlaps part of the metal layer 130 of the channel 118. In some embodiments, the insulating layer 120 may be disposed between the channel 118 and the gate 132 as the insulating layer of the gate 132. In some embodiments, the material of the insulating layer 120 includes silicon oxide, silicon nitride, silicon oxynitride, or a combination of the foregoing materials, but the disclosure is not limited thereto.

In some embodiments, the metal layer 130 may be patterned into the gate 132 shown in FIG. 1 through a development and etching process. An area in the semiconductor layer 110 that is shielded by the gate electrode 132 is the channel 118. In some embodiments, the insulating layer 120 and the metal layer 130 may be patterned using the same patterning step or using the same photomask. Therefore, in the top view direction, the contour of the insulating layer 120 may roughly correspond to or aligns with the contour of the metal layer 130, but the disclosure is not limited thereto.

In some embodiments, the charge storing component SR1B includes the photosensitive layer 140, the bottom electrode 116, and the top electrode 150. The photosensitive layer 140 is disposed on the bottom electrode 116, and the top electrode 150 is disposed on the photosensitive layer 140, but the disclosure is not limited thereto. In other words, the photosensitive layer 140 may be disposed between the bottom electrode 116 and the top electrode 150. In other embodiments (not shown), other layers may be optionally inserted between the photosensitive layer 140 and the bottom electrode 116, or between the photosensitive layer 140 and the top electrode 150. In some embodiments, the charge storing component SR1B may be disposed adjacent to the transistor SR1A, and the two may be electrically connected with each other. The photosensitive layer 140 of the charge storing component SR1B does not overlap the transistor SR1A in the normal direction of the substrate SB, but the disclosure is not limited thereto. In some embodiments, the transistor SR1A (such as the drain 114) is electrically connected with the charge storing component SR1B (such as the bottom electrode 116), and the transistor SR1A may be configured to drive the charge storing component SR1B. In some embodiments, the detection units SR1 may optionally include other transistors (not shown).

In some embodiments, the material of the photosensitive layer 140 includes semiconductor material. In some embodiments, the semiconductor material used to make the photosensitive layer 140 is different from the semiconductor material used to make the semiconductor layer 110, but the disclosure is not limited thereto. For example, the material of the photosensitive layer 140 includes silicon, germanium, indium gallium arsenide, lead sulfide or other similar semiconductor materials, but the disclosure is not limited thereto. In some embodiments, the photosensitive layer 140 is configured to convert light into current or voltage signals, for example. In some embodiments, the photosensitive layer 140 may include a photodiode. In some embodiments, the photosensitive layer 140 may be formed on the semiconductor layer 110 by a deposition method, such as chemical vapor deposition (CVD). In the process of depositing the photosensitive layer 140 or other subsequent layers, the gas (such as hydrogen or other gases) may affect the semiconductor layer 110, causing the amount of carriers in the semiconductor layer 110 to change (for example, increase), thereby increasing the conductivity of the semiconductor layer 110. In detail, whether there are other layers (for example, the gate 132) shielding on the different parts of the semiconductor layer 110 may affect the degree of gas influence. Therefore, the conductivity of the part of the semiconductor layer 110 (for example, the source 112, the drain 114, and/or the bottom electrode 116) that is not shielded by the gate 132 (that is, does not overlap with the gate 132) is different from the conductivity of the part that is shielded by the gate 132 (for example, channel 118). For example, the conductivity of the source 112, the drain 114, and/or the bottom electrode 116 may be higher than the conductivity of the channel 118, and the channel 118, for having lower conductivity, has semiconductor characteristics to achieve the function of a channel. Through the aforementioned influence of the gas in the process environment on the semiconductor characteristics, although the source 112, the drain 114, the bottom electrode 116 and the channel 118 are made by the same semiconductor layer material, but may different conductive properties without additional processing (for example, doping other components), such that different parts of the semiconductor layer 110 may be configured separately as different components, thereby reducing the process flow or manufacturing cost.

In some embodiments, the material of the top electrode 150 includes, for example, transparent conductive material. The photosensitive layer 140 may receive light passing through the top electrode 150, generating a photoelectric effect to generate carriers. In some embodiments, when R1A is not turned on, the carriers (electrons, holes) generated by the photoelectric effect in the photosensitive layer 140 may be temporarily stored in the charge storing component SR1B. The photosensitive layer 140, the top electrode 150, and the bottom electrodes 116 together form the charge storing component SR1B, for example.

In some embodiments, the insulating layer 160 may be disposed on or may cover the charge storing component SR1B (for example, the top electrode 150). In some embodiments, the insulating layer 160 may contact parts in the semiconductor layer 110 that are not shielded by the gate electrode 132 and/or the photosensitive layer 140, such as the source electrode 112 and the drain electrode 114. In some embodiments, the insulating layer 160 may cover the charge storing component SR1B and the transistor SR1A. In some embodiments, the flat layer 170 may be disposed on the insulating layer 160, and the insulating layer 160 may cover the transistor SR1A and the charge storing component SR1B. In some embodiments, the flat layer 170 may reduce the height difference caused by the transistor SR1A and the charge storing component SR1B to achieve a flattening effect, so as to facilitate the subsequent making of other layers.

In some embodiments, the insulating layer 160 may have a through hole V1 and/or a through hole V2 through a patterning process, and the position of the through hole V1 may correspond to or overlap the top electrode 150 of the charge storing component SR1B, and the position of the through hole V2 may correspond to or overlap the source 112 of the transistor SR1A. In some embodiments, the flat layer 170 may have a through hole V3 and/or a through hole V4 through another patterning process. The through hole V3 may correspond to or overlap the through hole V1, and the through hole V4 may correspond to or overlap the through hole V2. In some embodiments, a size of the through hole V3 may be larger than a size of the through hole V1, and a size of the through hole V4 may be larger than a size of the through hole V2. In some embodiments, the through hole V1 and the through hole V3 may expose part of the top electrode 150, and the exposed part of the top electrode 150 may be electrically connected with the bias line CL. In some embodiments, the through hole V2 and the through hole V4 may expose part of the source electrode 112, and the exposed part of the source electrode 112 may be electrically connected with the readout line RL.

In detail, after the flat layer 170 is patterned, the metal layer 180 may be disposed on the flat layer 170. The metal layer 180 includes the readout line RL and the bias line CL. In some embodiments, the bias line CL may be electrically connected with the top electrode 150 of the charge storing component SR1B via the through hole V1 and/or the through hole V3, and the readout line RL may be electrically connected with the source 112 via the through hole V2 and/or the through hole V4. In some embodiments, the material of the metal layer 180 and the material of the metal layer 130 may be the same or different. In some embodiments, the metal layer 180 and the metal layer 130 may include a single layer or a composite layer. In some embodiments, the protective layer 190 may be disposed on the metal layer 180 to protect the layers disposed under the protective layer 190. In some embodiments, the material of the protective layer 190, the insulating layer 120, and the insulating layer 160 may include silicon oxide, silicon nitride, silicon oxynitride or other similar insulating materials, but the disclosure is not limited thereto. In some embodiments, the light conversion layer PC1 may be disposed on the protective layer 190, or the light conversion layer PC1 may be disposed on the charge storing component SR1B and/or the transistor SR1A. In some embodiments, in the normal direction of the substrate SB, the light conversion layer PC1 at least overlaps the charge storing component SR1B. In some embodiments, in the normal direction of the substrate SB, the light conversion layer PC1 may overlap the charge storing component SR1B and/or the transistor SR1A. In some embodiments, the light conversion layer PC1 may cover the substrate SB. In some embodiments, the light conversion layer PC1 may convert the light received into light of different wavelengths; that is, the light conversion layer PC1 may be, for example, a light-to-light conversion layer. For example, the light conversion layer PC1 may include a scintillator, a fluorescent material, a filter material, a quantum dot material, other materials, or a combination of the above, but the disclosure is not limited thereto. In some embodiments, the material of the light conversion layer PC1 may be selected in accordance with the optical characteristics of the photosensitive layer 140 in the charge storing component SR1B and the application mode of the photo detector 100. For example, the photosensitive layer 140 may generate a photoelectric effect under visible light, and the detection light of the photo detector 100 includes, for example, non-visible light (such as X-ray, ultraviolet light, infrared light, and the like), therefore the material that converts invisible light into visible light may be selected as the light conversion layer PC1. For example, when applied to X-ray detection, a scintillator may be used as the light conversion layer PC1. The scintillator includes Cesium Iodide (Cpsi) and Gd2O2 S or other suitable materials, but the disclosure is not limited thereto. In other embodiments, a material that is more sensitive to a specific wavelength may be used as the photosensitive layer 140, and a material that may convert incident light into the light of specific wavelength may be used as the light conversion layer PC1, but the disclosure is not limited thereto. In some embodiments, the photo detector may be an X-ray detector. In some embodiments, the light conversion layer PC1 may be omitted in the photo detector 100, and the photosensitive layer 140 may generate a photoelectric effect on the incident light for sensing.

Figure 3:
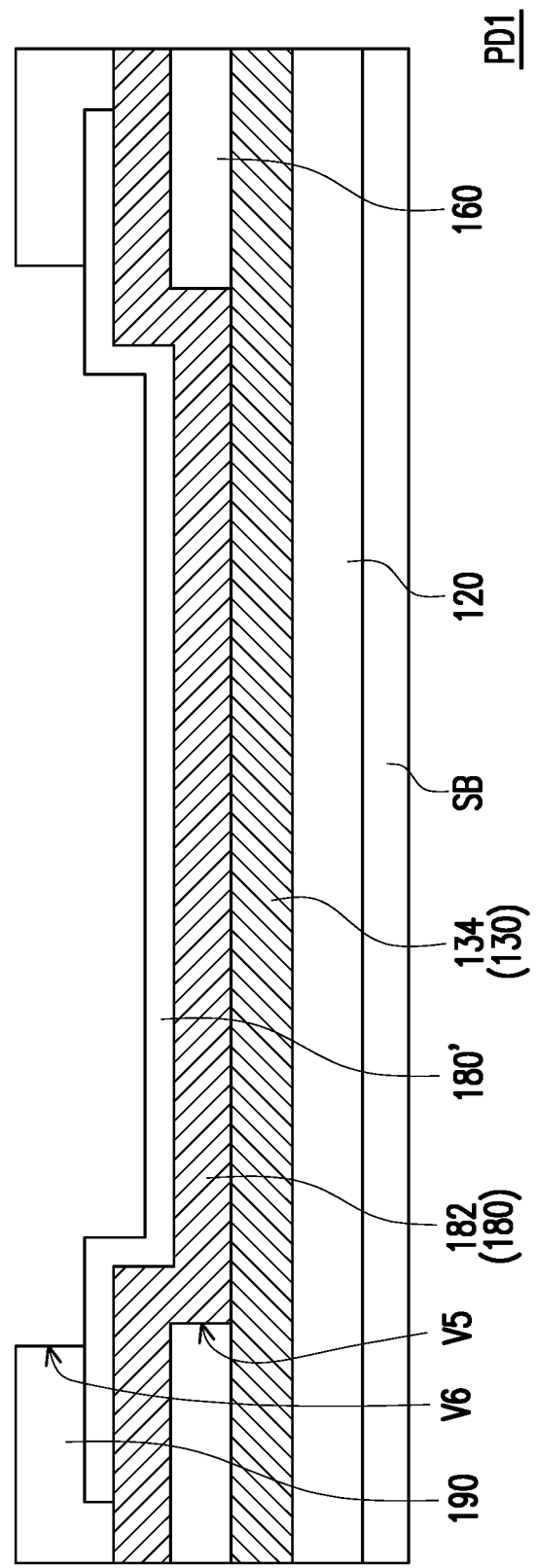
FIG. 3 is a schematic cross-sectional view of an embodiment of a bonding pad PD1 in a photo detector 100 of FIG. 1.

FIG. 3 is a schematic cross-sectional view of an embodiment of a bonding pad PD1 in a photo detector 100 of FIG. 1. The bonding pad PD1 shown in FIG. 1 and FIG. 3 is disposed at the peripheral area R2, and the bonding pad PD1 may be configured to connect to an external circuit, such as a driving circuit. The driving circuit includes a flexible circuit board, a rigid circuit board or a chip (IC), but the disclosure is not limited thereto. In some embodiments, the bonding pad PD1 may include a sub-part 134 disposed on the insulating layer 120, a sub-part 182 disposed on the sub-part 134, and/or a connecting part 180' disposed on the sub-part 182, but the disclosure is not limited thereto. FIG. 3 illustrates a bonding pad structure formed by stacking three conductive layers, but the disclosure is not limited thereto. In some embodiments, one of the aforementioned sub-parts may be optionally removed from the bonding pad PD1, or other sub-parts may be inserted into the aforementioned sub-parts.

In some embodiments, the sub-part 134 may belong to part of the metal layer 130. In some embodiments, the sub-part 134, the scan line SL, and/or the gate 132 may be obtained by patterning the same metal material layer, but the disclosure is not limited thereto. In some embodiments, the sub-part 182 may belong to part of the metal layer 180. In some embodiments, the sub-part 182, the bias line CL, and/or the readout line RL may be obtained by patterning the same metal material layer, but the disclosure is not limited thereto. In some embodiments, the sub-part 134 may be disposed on the insulating layer 120, the insulating layer 160 may be disposed between the sub-part 134 and the sub-part 182, and the connecting part 180' may be in contact with the sub-part 182 to be electrically connected, for example. In some embodiments, the protective layer 190 is disposed on the sub-part 182 and the connecting part 180'. In some embodiments, the insulating layer 160 may have a through hole V5. The through hole V5 may expose part of the sub-part 134, and the sub-part 182 and/or the connecting part 180' may be disposed in the through hole V5 of the insulating layer 160, such that the sub-part 134 and the sub-part 182 are electrically connected with each other. In some embodiments, the protective layer 190 has a through hole V6. The through hole V6 may correspond to the through hole V5 thereunder, and the through hole V6 may expose part of the connecting part 180', such that the conductive component (not shown) of the external circuit may be in contact with the part of the connecting part 180' exposed by the through hole V6 to be electrically connected. In some embodiments, the aforementioned light conversion layer PC1 does not overlap the bonding pad PD1, for example, and the bonding pad PD1 may be exposed to be electrically connected with the external circuit (not shown).

In some embodiments, as shown in FIG. 1 and FIG. 2, the photo detector 100 includes a transistor SR1A and a charge storing component SR1B. The source 112 and the drain 114 of the transistor SR1A, and the bottom electrode 116 of the charge storing component SR1B are formed of the semiconductor layer 110. In some embodiments, the source 112, the drain 114, the bottom electrode 116, and the channel 118 of the light sensing component 100 may be patterned using the same photomask, which helps simplify the structure of the photo detector 100, simplify the manufacturing process, or reduce the number of photomasks used, thereby saving manufacturing costs.

Figure 4:
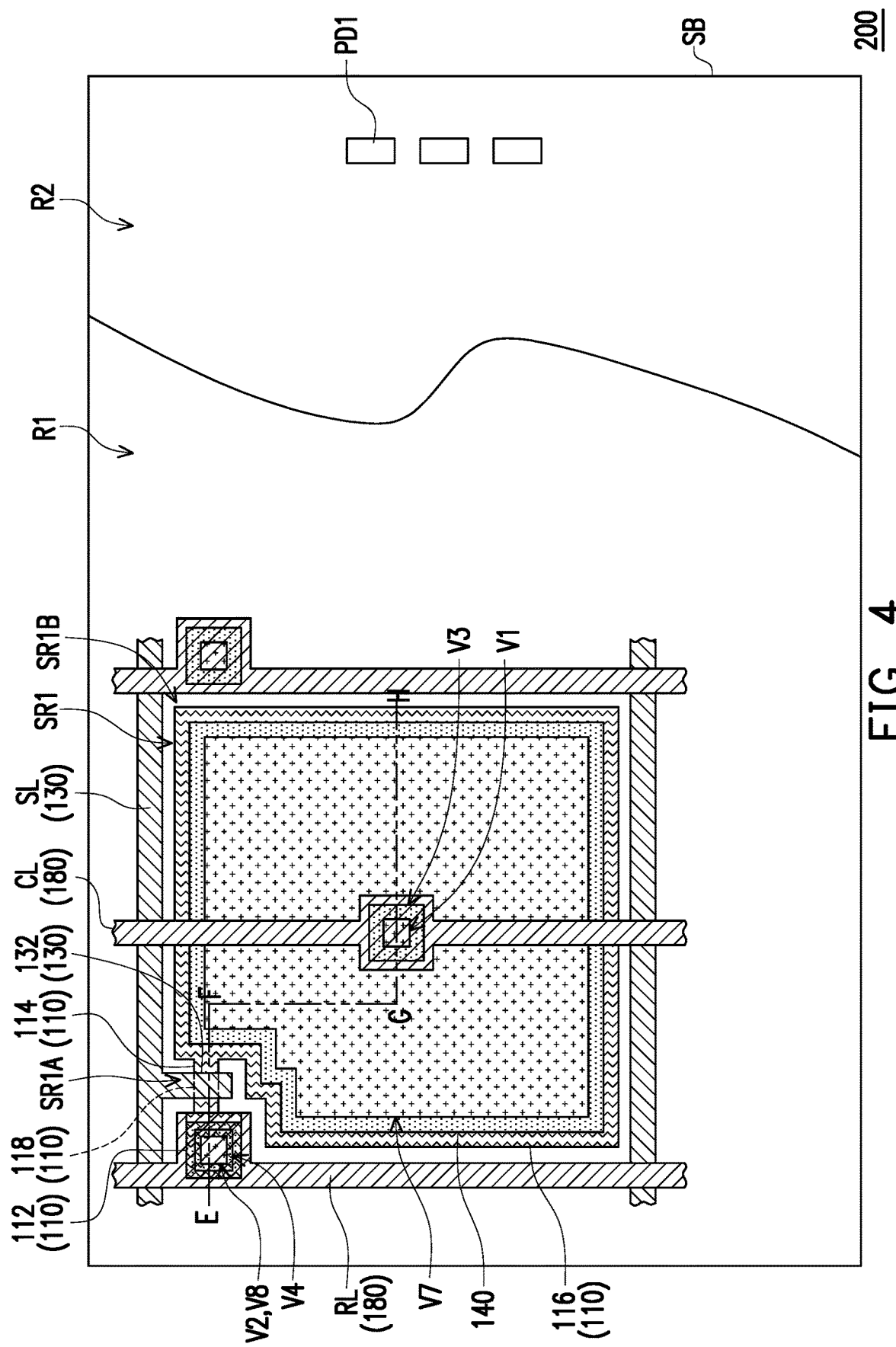
FIG. 4 is a schematic top view of a photo detector according to another embodiment of the disclosure.
Figure 5:
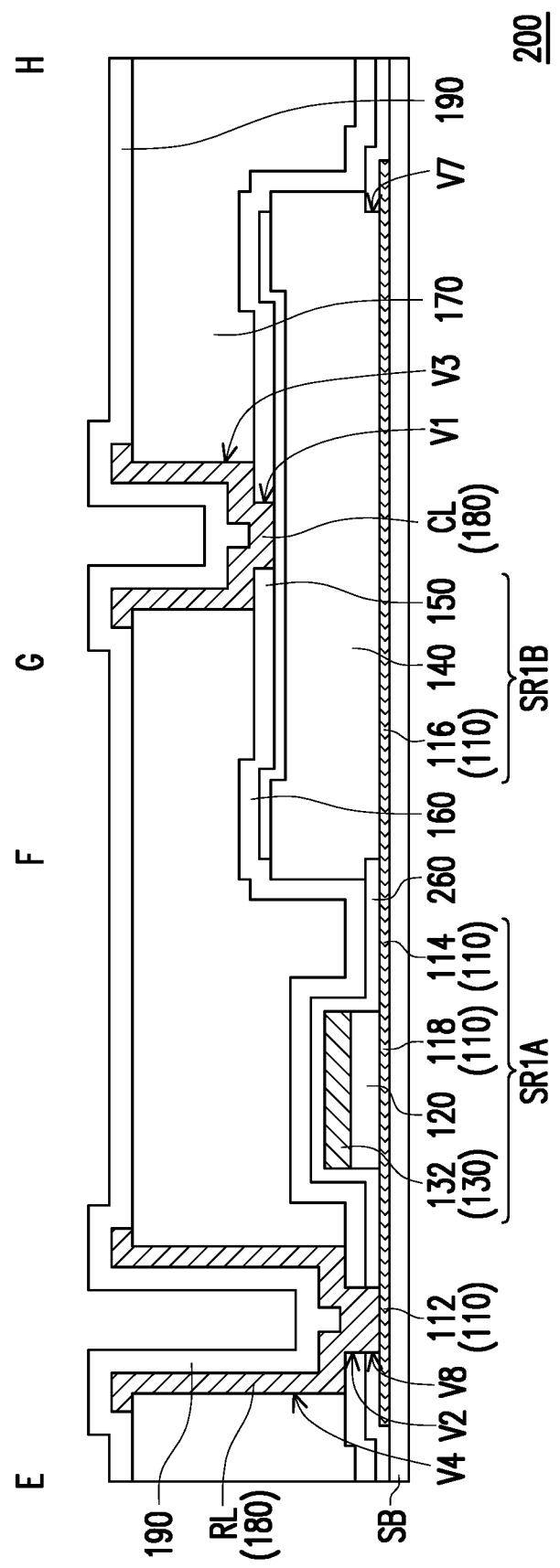
FIG. 5 is a schematic cross-sectional view of a photo detector in FIG. 4 along an E-F-G-H line.

FIG. 4 is a schematic top view of a photo detector according to another embodiment of the disclosure, and FIG. 5 is a schematic cross-sectional view of a photo detector in FIG. 4 along an E-F-G-H line. In FIG. 4 and FIG. 5, the photo detector 200 is similar to the photo detector 100 shown in FIG. 1 and FIG. 2, and the same component symbols in the two embodiments are configured to denote the same components. The main difference between the photo detector 200 and the photo detector 100 is that the photo detector 200 further includes an insulating layer 260 (as shown in FIG. 5). The insulating layer 260 is, for example, disposed on the semiconductor layer 110 and the metal layer 130, and the insulating layer 260 may be partially located between the photosensitive layer 140 and the semiconductor layer 110 (the bottom electrode 116). The insulating layer 260 may be patterned to have a through hole V7. The through hole V7 may expose part of the semiconductor layer 110 (bottom electrode 116). The photosensitive layer 140 may be partially disposed in the through hole V7 to contact the bottom electrode 116 for electrical connection.

In detail, the film layers making up the photo detector 200 include the semiconductor layer 110, the insulating layer 120, the metal layer 130, the insulating layer 260, the photosensitive layer 140, the top electrode 150, the insulating layer 160, the flat layer 170, the metal layer 180, and/or the protective layer 190, but the disclosure is not limited thereto. For the aforementioned dispositional relationships, functions, materials, characteristics, and the like, of the layers, reference may be made to the description of the foregoing embodiments, and will not be repeated. The photo detector 200 in FIG. 5 omits the aforementioned light conversion layer PC1, and the photo detector 200 may optionally include the light conversion layer PC1.

The photo detector 200 is similar to the photo detector 100. The source 112, the drain 114, the bottom electrode 116, and the channel 118 may be formed of the semiconductor layer 110, and the source 112, the drain 114, the bottom electrode 116, and the channel 118 are defined as above.

In some embodiments, the insulating layer 260 of the photo detector 200 may cover the gate 132 and/or part of the semiconductor layer 110. The insulating layer 260 may be made after the gate 132 is made and before the photosensitive layer 140 is made, but the disclosure is not limited thereto. In detail, after the gate electrode 132 (and the metal layer 130) is made, the insulating layer 260 may be formed, and the insulating layer 260 may be patterned such that the insulating layer 260 has the through hole V7 and/or a through hole V8. After that, the photosensitive layer 140 and the top electrode 150 are sequentially formed on the bottom electrode 116 to complete the charge storing component SR1B. The photosensitive layer 140 is electrically connected with the bottom electrode 116 through the via hole V7, for example. Then, the insulating layer 160, the flat layer 170, the metal layer 180, and/or the protective layer 190 are formed on the substrate SB to complete the photo detector 200, but the disclosure is not limited thereto. In some embodiments, since the insulating layer 260 is provided between the metal layer 130 and the photosensitive layer 140, the insulating layer 260 can cover most of the semiconductor layer 110, such that in the process of making the photosensitive layer 140, the metal layer 130 and most of the semiconductor layer 110 are protected by being covered by the insulating layer 260, which helps to reduce the metal layer 130 and/or the semiconductor layer 110 and improve the manufacturing yield.

Figure 6:
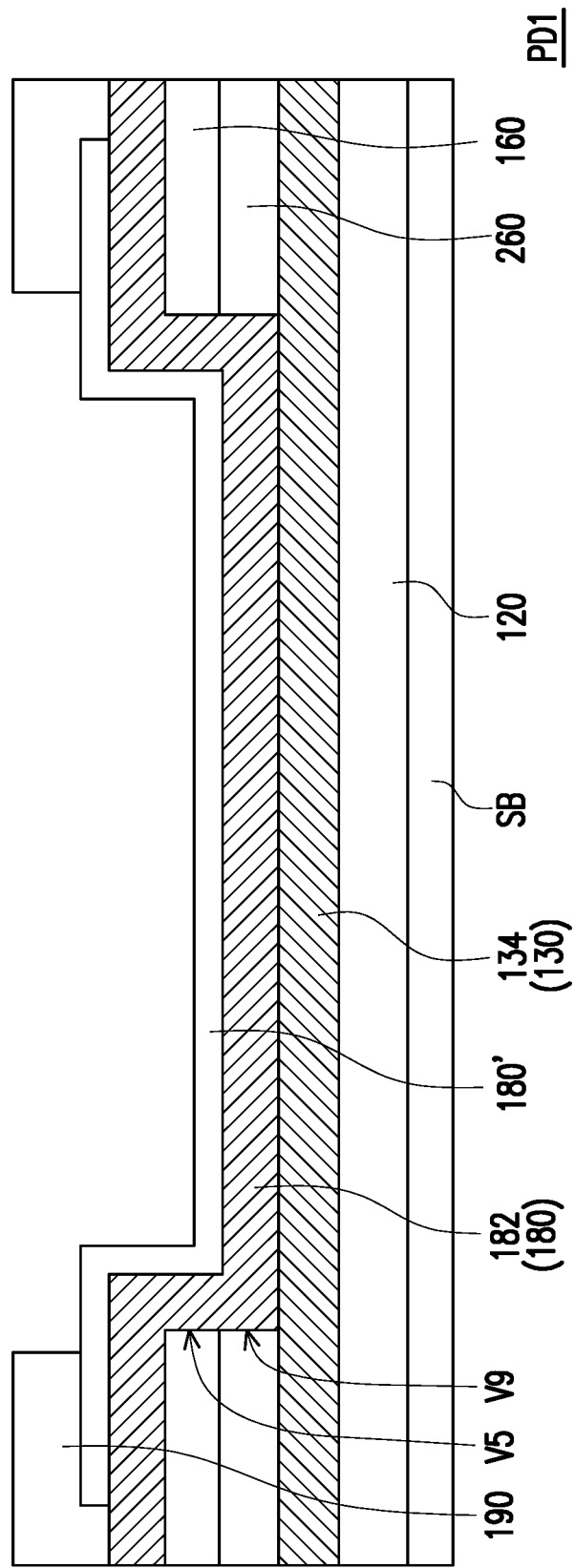
FIG. 6 is a schematic cross-sectional view of an embodiment of a bonding pad PD1 in a photo detector 200 of FIG. 4.

FIG. 6 is a schematic cross-sectional view of an embodiment of a bonding pad PD1 in a photo detector 200 of FIG. 4. The bonding pad PD1 shown in FIG. 4 and FIG. 6 is disposed at the peripheral area R2. The structure of the bonding pad PD1 in the photo detector 200 is similar to the structure of the bonding pad PD1 in the photo detector 100. The difference is that the insulating layer 260 and the insulating layer 160 may be provided between the sub-part 134 and the sub-part 182 of the bonding pad PD1 in the detector 200, and the insulating layer 260 may be located between the sub-part 134 and the insulating layer 160. In some embodiments, the insulating layer 260 may have a through hole V9. The through hole V9 may substantially correspond to or overlap the through hole V5 in the insulating layer 160. The through hole V9 and the through hole V5 may expose part of the sub-part 134, and the sub-part 182 may be disposed in the through hole V5 and the through hole V9 so as to be electrically connected with the sub-part 134. In some embodiments, the through hole V9 of the insulating layer 260 and the through hole V5 of the insulating layer 160 may be formed by, for example, the same patterning process, that is, formed by the same photomask process, for example, but the disclosure is not limited thereto. In some embodiments, a side of the through hole V9 and a side of the through hole V5 may be substantially aligned, but the disclosure is not limited thereto.

Figure 7:
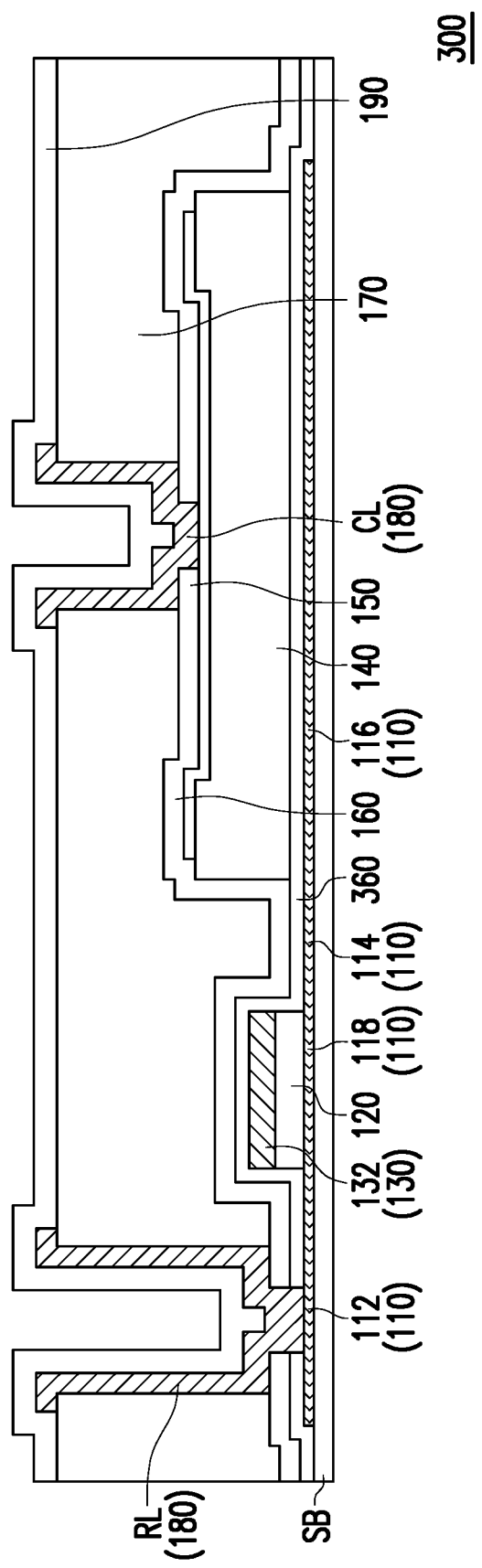
FIG. 7 is a schematic cross-sectional view of a photo detector according to another embodiment of the disclosure.

FIG. 7 is a schematic cross-sectional view of a photo detector according to another embodiment of the disclosure. The photo detector 300 of FIG. 7 is substantially the same as the photo detector 200 of FIG. 5. The main difference between the two is that the insulating layer 360 of the photo detector 300 replaces the insulating layer 260 of the photo detector 200. In FIG. 7, the insulating layer 360 may be without the through hole V7 of the insulating layer 260 in FIG. 5, such the photosensitive layer 140 and the bottom electrode 116 are separated by the insulating layer 360 and do not contact each other. In this way, the top electrode 150, the photosensitive layer 140, the insulating layer 360, and the bottom electrode 116 may form a metal oxide semi-tunneling diode (MIS) structure, but the disclosure is not limited thereto.

Figure 8:
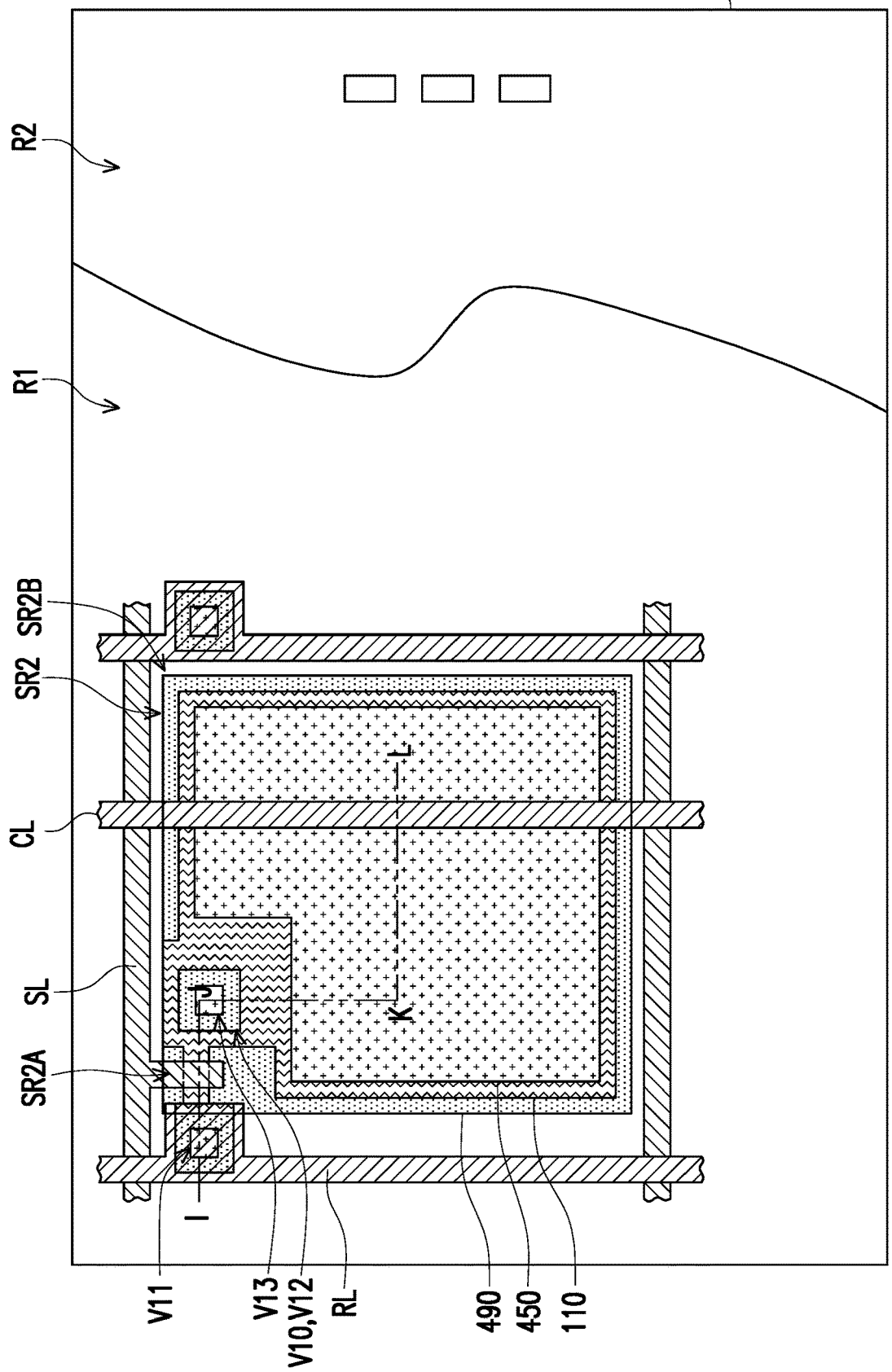
FIG. 8 is a schematic top view of a photo detector according to another embodiment of the disclosure.

FIG. 8 is a schematic top view of a photo detector according to another embodiment of the disclosure. In FIG. 8, the photo detector 400 includes a detection unit SR2 and bonding pads PD2. The detection unit SR2 is disposed on the substrate SB and located in the detection area R1, and the bonding pads PD2 are disposed on the substrate SB and located at the peripheral area R2. For clarity, FIG. 8 shows only one detection unit SR2 and three bonding pads PD2, but the disclosure is not limited thereto. In FIG. 8, the detection unit SR2 may include a transistor SR2A and a charge storing component SR2B.

Figure 9:
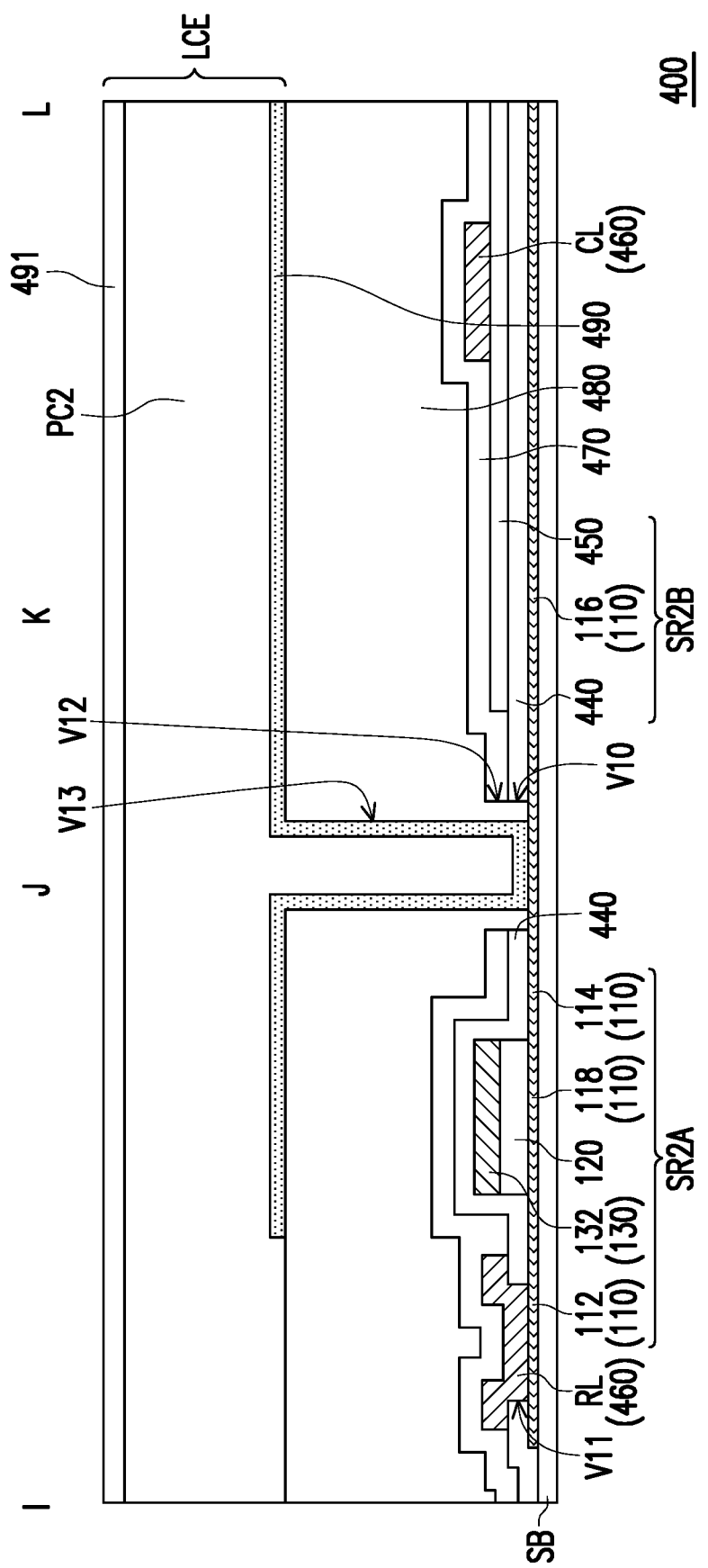
FIG. 9 is a schematic cross-sectional view of a photo detector in FIG. 8 along an I-J-K-L line.

FIG. 9 is a schematic cross-sectional view of a photo detector in FIG. 8 along an I-J-K-L line. Specifically, the photo detector 400 includes multiple film layers disposed on the substrate SB. The multiple film layers include the semiconductor layer 110, the insulating layer 120, the metal layer 130, an insulating layer 440, a top electrode 450, a metal layer 460, an insulating layer 470, a flat layer 480, and multiple first electrodes 490 (for example, a charge collection electrode), multiple light conversion layers PC2, and/or multiple second electrodes 491 that are sequentially made on the substrate SB. In some embodiments, the first electrode 490, the light conversion layer PC2, and the second electrode 491, for example, form a light conversion component LCE.

It should be understood that FIG. 8 and FIG. 9 only show one detection unit SR2, and the detection unit SR2 includes the light conversion component LCE, but the disclosure is not limited thereto. Other detection units may also include corresponding light conversion components LCE. In some embodiments, the light conversion components LCE in different detection units SR2 respectively have, for example, individual first electrodes 490 and are connected to each other. The light conversion layers PC2 of the light conversion components LCE in different detection units SR2 are, for example, connected to each other to form a whole, and the second electrodes 491 of the light conversion components LCE in different detection units SR2 are, for example, connected to each other to form a whole. However, the disclosure is not limited thereto.

In other words, the second electrodes 491 are formed of, for example, an unpatterned conductive layer, and the unpatterned conductive layer may correspond to or be located in the multiple detection units SR2. The light conversion layers PC2 are, for example, formed of an unpatterned light conversion material layer, and the unpatterned light conversion material layer may correspond to or be located in the multiple detection units SR2. In some embodiments, the light conversion component LCE may overlap the charge storing component SR2B. In some embodiments, the material of the light conversion layer PC2 (or the light conversion material layer) includes photoconductors such as amorphous selenium (a-Se), but the disclosure is not limited thereto. In some embodiments, the light conversion layer PC2 (or light conversion material layer) may be formed by, for example, vapor deposition, but the disclosure is not limited thereto. It should be noted that in FIG. 8, the light conversion layer PC2 and/or the second electrode 491 in the light conversion component LCE are omitted. In some embodiments, the second electrode 491 includes a transparent conductive layer such that light may pass through the second electrode 491 to be received by the light conversion layer PC2. The operation mode of the light conversion component LCE will be described later. The structure of the transistor SR2A of the photo detector 400 is roughly similar to the structure of the transistor SR1A. The source 112, the drain 114, the bottom electrode 116, and the channel 118 of the photo detector 400 may be formed of the semiconductor layer 110. The gate 132, the channel 118, the source 112, and the drain 114 may form the transistor SR2A. For the structure, material, manufacturing method, and dispositional relationship of the semiconductor layer 110, the insulating layer 120, and the metal layer 130, reference may be made to the foregoing embodiments, and will not be repeated here.

In some embodiments, the insulating layer 440 may cover the gate 132 and part of the semiconductor layer 110. The insulating layer 440 may be patterned to have a through hole V10 and/or a through hole V11. The through hole V10 may correspond to the drain 114 of the semiconductor layer 110, and the through hole V11 may correspond to the source 112 of the semiconductor layer 110, but the disclosure is not limited thereto. Via the through hole V10 and the through hole V11, at least part of the source 112 and at least part of the drain 114 are not covered by the insulating layer 440, such that other layers can subsequently be electrically connected with the source 112 and the drain 114 via the through hole V10 and the through hole V11. In some embodiments, the top electrode 450 of the charge storing component SR2B may be disposed on the insulating layer 440, and in the normal direction of the substrate SB, the top electrode 450 may overlap the bottom electrode 116 of the charge storing component SR2B. The charge storing component SR2B includes the bottom electrode 116 (part of the semiconductor layer 110), the top electrode 450, and the insulating layer 440. The insulating layer 440 may be disposed between the top electrode 450 and the bottom electrode 116 and separate the top electrode 450 and the bottom electrode 116 from each other. In this way, the insulating layer 440 is disposed between the top electrode 450 and the bottom electrode 116 to form a capacitor structure, which serves as the charge storing component SR2B, but the disclosure is not limited thereto. In such embodiment, the bottom electrode 116 is defined as, for example, the part of the semiconductor layer 110 that overlaps the top electrode 450. In some embodiments, the material of the insulating layer 440 includes silicon oxide, silicon nitride, silicon oxynitride, or a combination thereof, but the disclosure is not limited thereto. The material of the insulating layer 440 may be determined according to the charge storing capacity required by the charge storing component SR2B. In some embodiments, the metal layer 460 may include the bias line CL disposed on the top electrode 450 and the readout line RL disposed on the source electrode 112. The bias line CL may contact the top electrode 450 to be electrically connected with each other, or the bias line CL may contact the top electrode 450 without going through a through hole. The readout line RL may be provided in the through hole V11 of the insulating layer 440 and electrically connected with the source 112.

In some embodiments, the insulating layer 470 may be disposed on or may cover the metal layer 460, the top electrode 450, and the insulating layer 440. The insulating layer 470 may be patterned to have a through hole V12. The through hole V12 may substantially correspond to or overlap the through hole V10 in the insulating layer 440. The through hole V12 and the through hole V10 may expose part of the semiconductor layer 110 (for example, the drain 114), such that the first electrode 490 can be electrically connected with the semiconductor layer 110 (for example, the drain 114).

In some embodiments, the material of the insulating layer 470 may be the same as or different from the material of the insulating layer 440. In some embodiments, the flat layer 480 is disposed on the insulating layer 470 to reduce the height difference caused by the transistor SR2A and the charge storing component SR2B, and achieve a flattening effect. The flat layer 480 may have a through hole V13. The through hole V13 may substantially correspond to or overlap the through hole V10 and/or the through hole V12. In some embodiments, a size of the through hole V13 may be smaller than a size of the through hole V10 and the through hole V12, and part of the flat layer 480 may be located in the through hole V10 and/or the through hole V12, but the disclosure is not limited thereto. In some embodiments, the through hole V10 and the through hole V12 may be formed through the same patterning process, but the disclosure is not limited thereto.

In some embodiments, the first electrode 490 is disposed on the flat layer 480, and the first electrode 490 is electrically connected with the drain 114 via the through hole V13, the through hole V12, and/or the through hole V10. In some embodiments, the material of the first electrode 490 may include transparent conductive material, but the disclosure is not limited thereto.

In some embodiments, as described above, the first electrode 490, the light conversion layer PC2, and the second electrode 491, for example, form the light conversion component LCE. The first electrode 490 may be disposed in one detection unit SR2 and electrically connected with the corresponding transistor SR2A and/or the charge storing component SR2B. In some embodiments, the electric field is generated by applying different voltages to the first electrode 490 and the second electrode 491 of the light conversion component LCE, such that the light conversion layer PC2 converts the light received into carriers (electrons, holes). Since the first electrode 490 is electrically connected with the semiconductor layer 110, the first electrode 490 is electrically connected with the semiconductor layer 110 via the through hole V13, the through hole V12, and/or the through hole V10, for example, the carriers may be transferred to the corresponding charge storing component SR2B via the first electrode 490 and the semiconductor layer 110 for temporary storage, but the disclosure is not limited thereto. In addition, since the drain 114 of the transistor SR2A is electrically connected with the bottom electrode 116 of the charge storing component SR2B, when the transistor SR2A is turned on, the carriers temporarily stored in the charge storing component SR2B may be read through the readout line RL, thereby realizing the light detection function, but the disclosure is not limited thereto.

Figure 10:
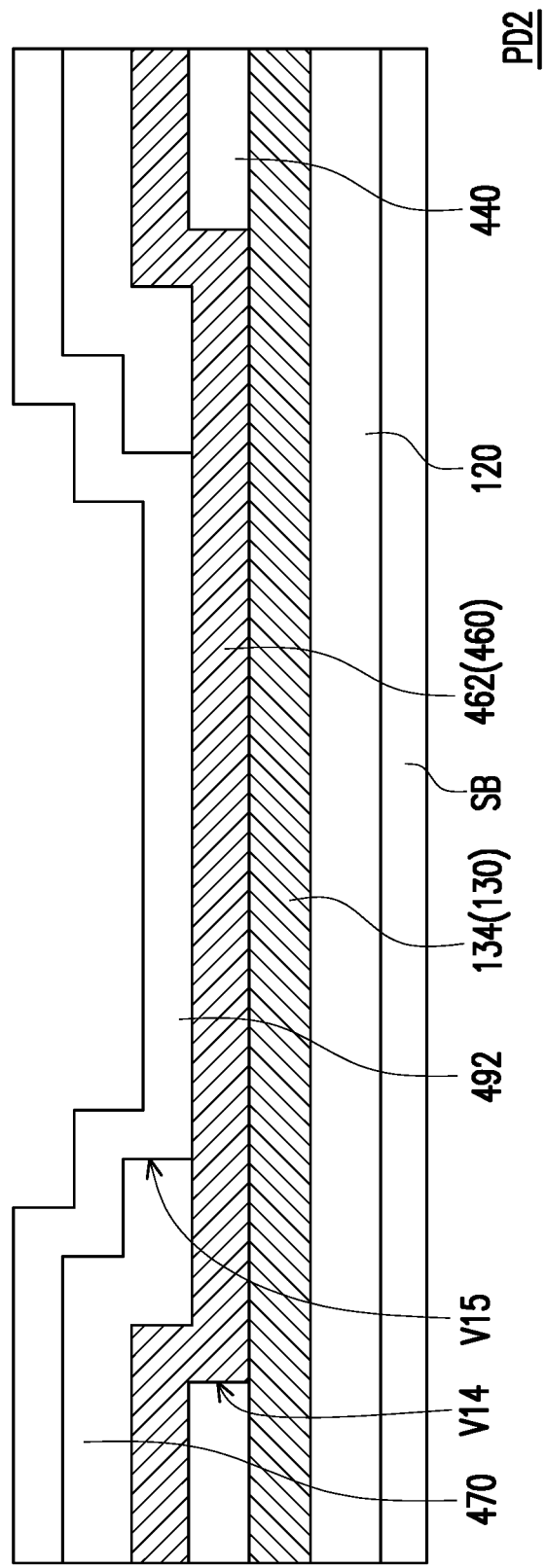
FIG. 10 is a schematic cross-sectional view of an embodiment of a bonding pad PD2 in a photo detector 200 of FIG. 8.

FIG. 10 is a schematic cross-sectional view of an embodiment of the bonding pad PD2 in the photo detector 200 of FIG. 8. The bonding pads PD2 shown in FIG. 8 and FIG. 10 are disposed at the peripheral area R2 and may be configured to connect to the external circuit, such as the driving circuit. The bonding pad PD2 may include the sub-part 134, a sub-part 462, and a connecting part 492. The sub-part 462 is disposed on the sub-part 134. The connecting part 492 is disposed on the sub-part 462 and contacts the sub-part 462, such that the two may be electrically connected with each other. FIG. 10 illustrates a bonding pad structure formed by stacking three conductive layers, but the disclosure is not limited thereto. In some embodiments, one of the sub-part 134 and the sub-part 462 may be omitted, or other sub-parts may be inserted into the sub-parts.

In some embodiments, the sub-part 134 may belong to part of the metal layer 130. In some embodiments, the sub-part 134, the scan line SL, and/or the gate 132 may be obtained by patterning the same metal material layer, but the disclosure is not limited thereto. In some embodiments, the sub-part 462 may belong to part of the metal layer 460. In some embodiments, the sub-part 462, the bias line CL, and/or the readout line RL may be obtained by patterning the same metal material layer, but the disclosure is not limited thereto. In some embodiments, the connecting part 492 may be coplanar with the first electrode 490 in FIG. 9, that is, the connecting part 492, and the first electrode 490 in FIG. 9 have the same material or may be made in the same manufacturing step. In some embodiments, the sub-part 134 is disposed on the insulating layer 120, the insulating layer 440 is disposed between the sub-part 134 and the sub-part 462, and the insulating layer 440 may have a through hole V14. The through hole V14 may expose part of the sub-part 134, and the sub-part 462 may be disposed in the through hole V14 to contact the sub-part 134 for electrical connection. In some embodiments, the insulating layer 470 is disposed between the sub-part 462 and the connecting part 492, and the insulating layer 470 has a through hole V15. The through hole V15 may expose part of the sub-part 462, and the connecting part 492 may be disposed in the through hole V15 to contact the sub-part 462 for electrical connection. In some embodiments, the light conversion layer PC2 and/or the second electrode 491 do not overlap the bonding pad PD2, such that the bonding pad PD2 may be exposed for electrical connection with an external circuit (not shown).

The photo detector 400 shown in FIG. 8 and FIG. 9 includes the transistor SR2A and the charge storing component SR2B. The source 112 and drain 114 of the transistor SR2A and the bottom electrode 116 of the charge storing component SR2B are formed of the semiconductor layer 110. The channel 118, source 112, and drain 114 of the transistor SR2A are coplanar. Therefore, different parts of the single-layer semiconductor layer 110 may be used as multiple components, which may simplify the structure, reduce the manufacturing steps, or reduce the manufacturing cost.

Figure 11:
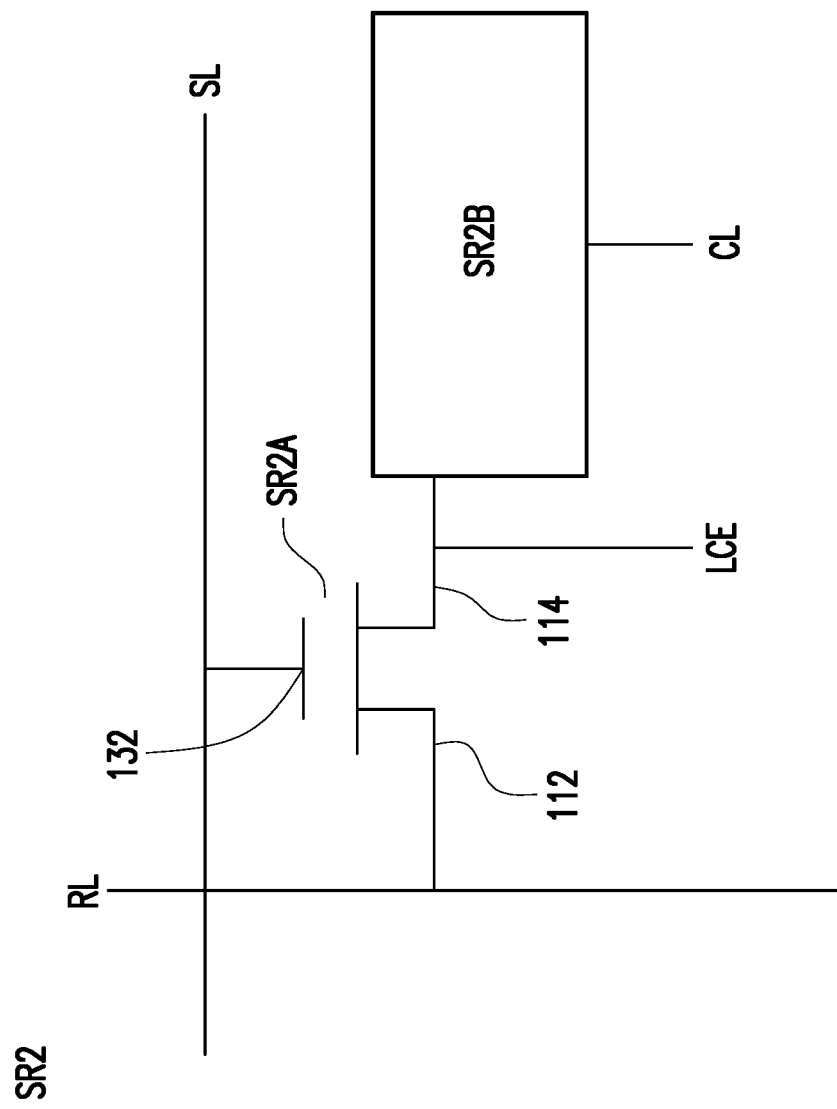
FIG. 11 is a schematic view of a partial equivalent circuit of a photo detector of the disclosure.

FIG. 11 is a schematic view of a partial equivalent circuit of a photo detector of the disclosure. As shown in FIG. 11, the equivalent circuit view may be, for example, a simple equivalent circuit view of the photo detector 400. The actual equivalent circuit may be connected to other electronic components (such as transistors, capacitors, but the disclosure is not limited thereto) according to requirements. For example, the detection unit SR2 of the photo detector 400 may include the transistor SR2A and the charge storing component SR2B, and the charge storing component SR2B is electrically connected with the transistor SR2A. The gate 132 of the transistor SR2A is electrically connected with the scan line SL. One of the source 112 and the drain 114 is electrically connected with the readout line RL, and the other one of the source 112 and the drain 114 is electrically connected with the charge storing component SR2B. The charge storing component SR2B may be electrically connected with the bias line CL, but the disclosure is not limited thereto. In the photo detector 400, since the charge storing component SR2B (refer to FIG. 9) of a capacitor structure is included, the photo detector 400 further includes, for example, the light conversion component LCE. The light conversion component is connected to, for example, the transistor SR2A and/or charge storing component SR2B. In addition, in another embodiment (not shown), in the case of the photo detector 100 (as shown in FIG. 1), the detection unit SR2 in FIG. 11 may be replaced by the detection unit SR1, and the charge storing component SR2B may be replaced by charge storing component SR1B. However, it should be noted that the light conversion component LCE shown in FIG. 11 may not be required in the photo detector 100.

In summary, in the photo detector of the present disclosure, the transistor and the charge storing component are realized by the same semiconductor layer, which helps to reduce the manufacturing steps, simplify the structure design, and reduce costs.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:
1. A photo detector, comprising:
a transistor, comprising a gate, a source and a drain;
a charge storing component, electrically connected with the transistor and comprising a top electrode and a bottom electrode; and
a bias line, the bias line electrically connected with the top electrode of the charge storing component,
wherein the source and the drain of the transistor and the bottom electrode of the charge storing component are formed by a semiconductor layer.
2. The photo detector according to claim 1, wherein the transistor comprises a channel disposed between the source and the drain.
3. The photo detector according to claim 2, wherein the channel, the source and, the drain are coplanar.
4. The photo detector according to claim 2, wherein the gate is disposed on the channel.
5. The photo detector according to claim 2, wherein the source, the drain, the bottom electrode, and the channel are connected to each other.
6. The photo detector according to claim 2, wherein a conductivity of the source, the drain, and the bottom electrode is higher than a conductivity of the channel.
7. The photo detector according to claim 1, wherein a material of the semiconductor layer comprises metal oxide.
8. The photo detector according to claim 1, wherein the photo detector is an X-ray detector.
9. The photo detector according to claim 1, wherein the charge storing component comprises a photosensitive layer disposed between the bottom electrode and the top electrode, and a material of the photosensitive layer is different from the semiconductor layer.

10. The photo detector according to claim 9, wherein the material of the photosensitive layer comprises a semiconductor material of silicon, germanium, indium gallium arsenide, or lead sulfide.

11. The photo detector according to claim 9, wherein the bottom electrode overlaps the photosensitive layer.

12. The photo detector according to claim 1, wherein the source, the drain, and the bottom electrode of the charge storing component are connected to each other.

13. The photo detector according to claim 12, wherein the charge storing component comprises an insulating layer, and the insulating layer is disposed between the top electrode and the bottom electrode.

14. The photo detector according to claim 1, further comprising a light conversion layer disposed on the charge storing component and overlapping the charge storing component.

15. The photo detector according to claim 14, wherein the light conversion layer comprises a scintillator, a fluorescent material, a filter material, a quantum dot material, other materials, or a combination of the foregoing.

16. The photo detector according to claim 1, further comprising an insulating layer covering the top electrode of the charge storing component.

17. The photo detector according to claim 16, wherein the insulating layer contacts the source and the drain.

18. The photo detector according to claim 16, wherein the insulating layer further covers the transistor.

19. The photo detector according to claim 1, further comprising a readout line, the readout line electrically connected with the source.

* * * * *